United States Patent [19]
Ueda et al.

[11] Patent Number: 4,786,891
[45] Date of Patent: Nov. 22, 1988

[54] ABSOLUTE ENCODER FOR LINEAR OR ANGULAR POSITION MEASUREMENTS

[75] Inventors: Toshitsugu Ueda; Fusao Kohsaka; Toshio Iino; Hiroshi Nakayama, all of Tokyo, Japan

[73] Assignee: Yokogawa Electric Corporation, Tokyo, Japan

[21] Appl. No.: 849,574

[22] Filed: Apr. 8, 1986

[51] Int. Cl.$^4$ ............................................. H03M 1/22
[52] U.S. Cl. ............................... 341/13; 250/231 SE; 33/125 A
[58] Field of Search ....................... 340/347 P, 347 M; 250/231 SE; 33/125 A

[56] References Cited

U.S. PATENT DOCUMENTS

| | | | |
|---|---|---|---|
| 2,224,646 | 12/1940 | Freidman et al. | 235/462 X |
| 3,092,402 | 6/1963 | Reed | 235/494 X |
| 4,056,850 | 11/1977 | Brown | 318/574 X |
| 4,251,842 | 2/1981 | Iwasaki et al. | 360/110 X |
| 4,504,832 | 3/1985 | Conte | 340/347 P X |
| 4,529,964 | 7/1985 | Minami et al. | 340/347 P X |
| 4,572,952 | 2/1986 | March | 340/347 P X |

Primary Examiner—T. J. Sloyan
Attorney, Agent, or Firm—Moonray Kojima

[57] ABSTRACT

An encoder device of the absolute position type for outputting a shift position or angle of rotation relative to the absolute position. The device comprises a code plate having first and second grid patterns wherein information is stored as 1 or 0 in a periodic manner at pitches slightly different from each other; first and second sensory arrays for detecting the first and second grid patterns; driving means for driving the sensors relative to the grid patterns and for obtaining an alternating signal from each array; and computation means for measuring the phase angle of the alternating signal from each array, and the phase angle difference therebetween and for calculating the position using such phase angles. Advantageously, the invention is suitable for miniaturization due to its simplicity, reliability, and efficiency.

10 Claims, 8 Drawing Sheets

ABSOLUTE ENCODER FOR LINEAR OR ANGULAR POSITION MEASUREMENTS

BACKGROUND OF THE INVENTION

1. Field of Invention

This invention relates to an encoder of the absolute position type which outputs signals representing a shift position or an angle of rotation in relation to an absolute position; and more particularly, to such an encoder comprising a code plate having two sets of grid patterns and two sets of sensors facing the grid patterns, with the grid patterns containing information represented by "1" and "0" disposed periodically.

2. Description of the Prior Art

Rotary and linear encoders are known having a code plate wherein information is stored as "1" and "0" in the form of a grid pattern with a plurality of sensors to detect the grid pattern. The minimum measurable limit of measurement of shift position and angle of rotation is determined and limited by the extent to which the grid pattern can be miniaturized. Thus, accuracy and resolution at higher levels are limited.

SUMMARY OF THE INVENTION

Accordingly, an object of the invention is to overcome the aforementioned and other disadvantages and deficiencies of the prior art.

Another object is to provide an encoder of the absolute position type which has high accuracy and resolution.

The foregoing and other objects are attained by the invention which encompasses an encoder comprising a code plate having a first grid pattern wherein items of information represented by "1" and "0" are disposed periodically, and a second grid pattern wherein items of information represented by "1" and "0" are disposed periodically at a pitch slightly different from that of the disposition of the first grid pattern; a first sensor array for detecting the first grid pattern; a second sensory array for detecting the second grid pattern; a driving means for driving the first and second sensor arrays and for obtaining an alternating signal from each of the sensor arrays; and a computation circuit, supplied with the alternating signals from each sensor array and a reference signal from the driving means, for computing a position and then outputting a signal representing that position.

DETAILED DESCRIPTION OF PREFERRED EMBODIMENTS

Figures 1A, 1B:
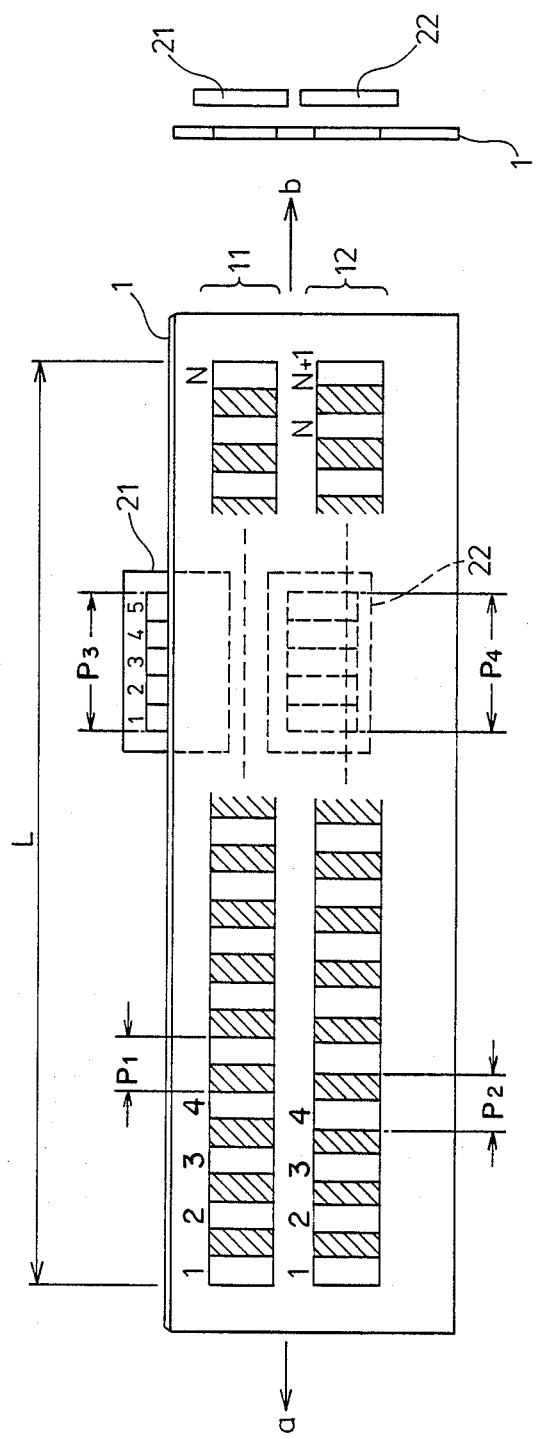
FIGS. 1A, 1B are pictorial views depicting an illustrative code plate used in the invention.

Turning now to FIGS. 1A, 1B, FIG. 1A is a perspective illustration, and FIG. 1B is a side elevational view, of a code plate 1. The code plate 1, described hereat, is a linear encoder having optical based grid patterns.

Code plate 1 comprises a first grid pattern 11 and a second grid pattern 12, wherein items of information are stored as "1" and "0" by portions which are transparent or opaque, respectively, and periodically disposed at a pitch $P_1$ and $P_2$, respectively. Pitch $P_1$ is slightly different from pitch $P_2$, as shown. In this example, the first grid pattern 11 has N items of information "1" and "0" disposed at pitch $P_1$ within the range of a predetermined length. The second grid pattern 12 has N+1 items of information "1" and "0" disposed at pitch $P_2$ (wherein $P_1 > P_2$) within the same range.

A first sensor array 21 is placed in the vicinity of first grid pattern 11, in order to detect the first grid pattern 11. A second sensor array 22 is placed in the vicinity of second grid pattern 12, in order to detect the second grid pattern 12. First and second sensory arrays 21 and 22 each comprises at least three photodiodes disposed within a length $P_3$ (for array 21) and a length $P_4$ (for array 22). In FIG. 1 there are depicted for each array 21 and 22, five photodiodes, to show that the invention is not limited to three.

The front of code plate 1 is irradiated with a parallel light, and each light receiving surface of sensors 21 and 22 is irradiated with light passing through the transparent portions of the grid pattern 11,12 (thus forming a stripe light pattern), respectively. Code plate 1 is given a shift, which is to be measured, and is moved relative to each sensor array in the direction indicated by arrow a or arrow b. The stripe light pattern, with which each sensor array 21,22, is irradiated, are moved in accordance with that relative movement.

Figure 2:
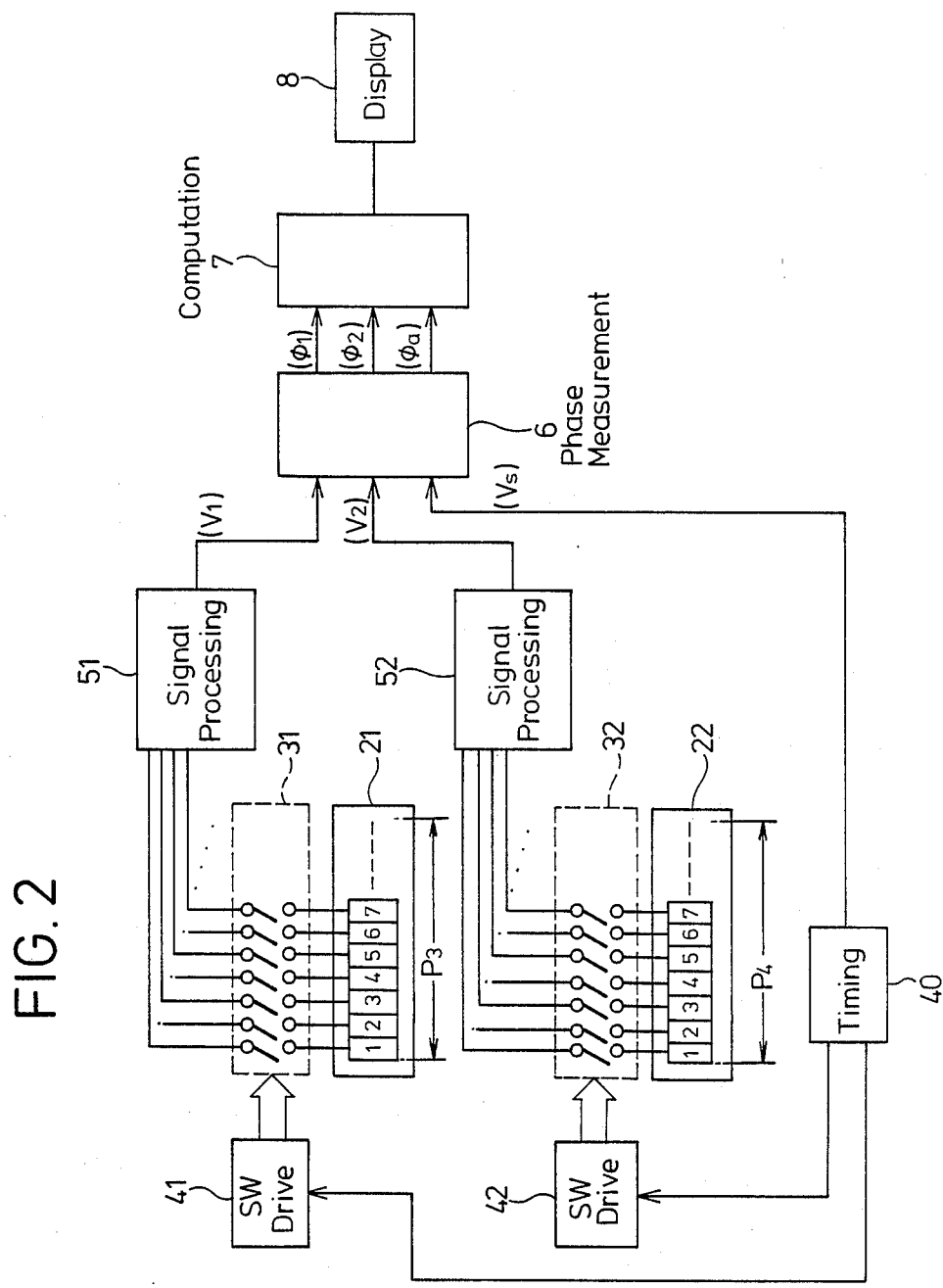
FIG. 2 is a block diagram depicting electrical connections of the illustrative embodiment of the invention.

In FIG. 2, each of the first and second sensor arrays 21,22 comprises an arrangement of a plurality of silicon photodiodes 1, 2, 3, . . . , . First and second switch circuits 31,32 are respectively connected to the photodiodes in first and second sensor arrays 21, 22. First and second switch driving circuits 41,42 successively turn ON and OFF the switches in each switch circuit 31,32, at a constant time interval. A timing circuit 40 generates different timing signals.

A first signal processing circuit 51 is fed signals from the first switch circuit 31 and amplifies and filters these signals and then changes the signals into rectangular waves through a wave form shaping process.

A second signal processing circuit 52 is fed signals from the second switch circuit 32 and amplifies and filters these signals and then changes the signals into rectangular waves through a wave form shaping process.

These signal processing circuits 51,52 output alternating signals $V_1$ and $V_2$, respectively, which have periods which respectively correspond to each scanning period of switch circuit 31,32, respectively.

A phase measurement circuit 6 is supplied from signal processing circuits 51,52 with the alternating signals $V_1$ and V₂, and from timing circuit 40 with an alternating reference signal $V_s$ and measures the difference $\phi_a$ between the phase angles of the alternating signals $V_1$ and $V_2$, and the differential phase $\phi_i$ between the alternating reference signal $V_s$ and the alternating signal $V_1$ or $V_2$.

A computation circuit is fed with signals from the phase measurement circuit 6 and carries out given calculations so as to obtain a signal relative to the absolute shift position. A display means 8 displays the result of the calculation.

The operation of the illustrative embodiment will be explained with reference to the wave form charts of FIGS. 3 and 4. Assume that the number of transparent slits of the first grid pattern 11, formed in the code plate 1, is na and the number of transparent slits of the grid pattern 12 formed in code plate 1 is nb (wherein na≠nb). Also, assume that code plate 1 is fixed to an object, for example, a table whose shift position is to be measured, and that it is moved with the table. Assume further that the shift position of code plate 1 is X, and that each of the switch circuits 31, 32 is scanned by the reference wave signal Vs(angular velocityω).

The light passed through the first grid pattern and the second grid pattern is projected on the respective sensory arrays 21 and 22 as grid patterns. Each of the sensor arrays 21 and 22 functions as a moving grid shifting at a predetermined speed in correspondence to the reference wave signal VS (an angular velocityω) and even when any photodiode that is not exposed to the light passed through the transparent patterns is selected on these sensor arrays 21 and 22 by the switch, no output signal generates from the diode but when one that is exposed to that light is selected, a signal corresponding to the amount of light received generates from the photodiode. If the transparent pattern shifts, it is received by another photodiode at a different position and a signal shifted in timing (phase) is generated therefrom. In this case, the switches adopted to select the diodes are activated in sequence in a predetermined cycle period and from the sensor arrays 21 and 22 the signals Va and Vb as expressed by the formulae (1) and (2) and each having a correspondence to the position x of the code plate and a predetermined cycle period (angular velocityω).

The first and second signal processing circuits 51 and 52 shape the signals Va and Bv to rectangular waves and impress them upon the phase measuring circuit 6.

$$V_a = V_{a0} \sin\left(\omega t + na\frac{2\pi X}{L}\right) \quad (1)$$

$$V_b = V_{b0} \sin\left(\omega t + nb\frac{2\pi X}{L}\right) \quad (2)$$

This step of obtaining the signals represented by formula (1) and formula (2) pertains to a prior art process.

Figure 3:
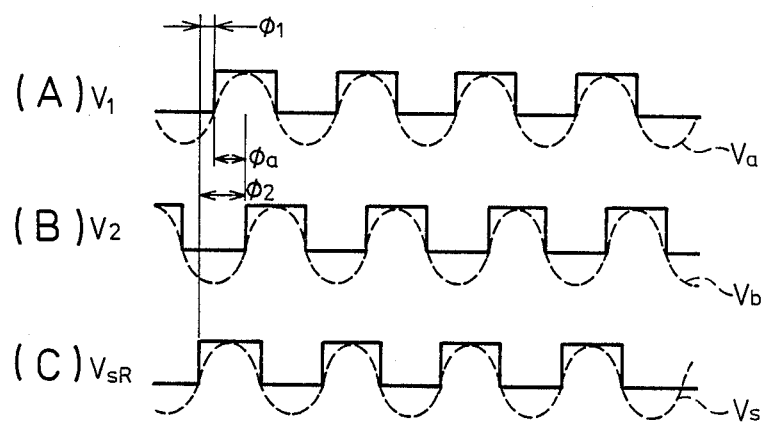
FIGS. 3, comprising lines (A), (B), and (C), and 4, comprising lines (A), (B), and (C), are diagrams depicting operating wave forms.
Figure 4:
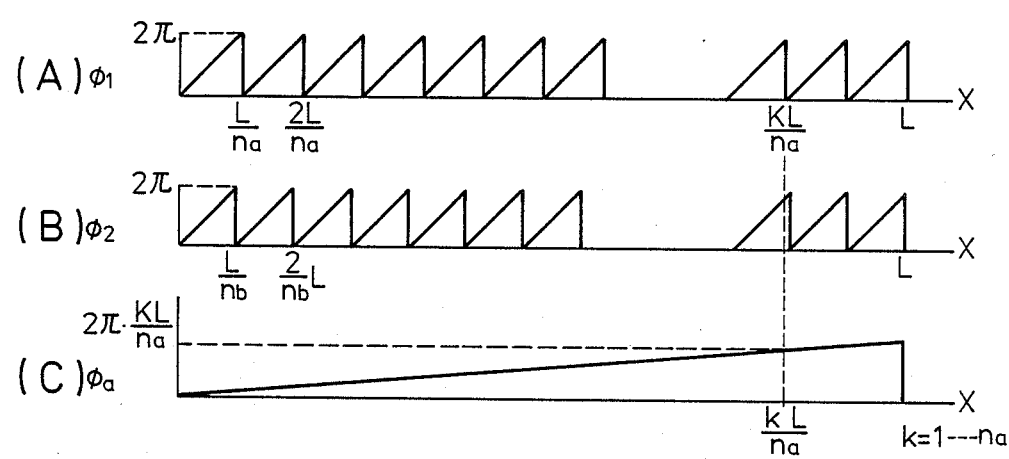

FIGS. 3 and 4, on the other hand, show the inventive operaional steps. FIG. 3 shows respective signal wave forms of the signals $V_1$, $V_2$ and $V_{SR}$ obtained through wave form shaping processes mentioned above with respect to FIG. 2.

Phase measurement circuit 6 measures both phase angles $\phi_1$ and $\phi_2$ of the alternating signals $V_1$ ($V_a$) and $V_2$ ($V_b$) and measures the difference $\phi_a$ between the phase angles of the signals $V_1$ and $V_2$. The phase angles $\phi_1$, $\phi_2$ and $\phi_a$ are represented by the following formulas.

$$\phi_1 = na\frac{2\pi X}{L} \quad (3)$$

$$\phi_2 = nb\frac{2\pi X}{L} \quad (4)$$

$$\phi_a = (na - nb) \cdot \frac{2\pi X}{L} \quad (5)$$

FIG. 4 shows wave form charts illustrating the relationship between shift position and phase angles $\phi_1$, $\phi_2$ and $\phi_a$. It is assumed here that na−nb=1.

Then, the difference $\phi_a$, between the phase angles of the signals $V_1$ and $V_2$, represents the absolute position X; and $\phi_1$ and $\phi_2$ represent positions between the transparent slits.

That is, the value obtained by dividing the phase angles by $2\pi/na$ (or $2\pi/nb$) is equal to that obtained by adding an integral number j to a position value Δ within the pitch $P_1$ (or $P_2$) of the transparent slit.

$$\frac{\phi_a}{\frac{2\pi}{na}} = j + \Delta \quad (6)$$

Accordingly, the shift position X is represented by below formula (7). A signal representing absolute position X can be obtained by calculator circuit 7 through calculation using the formula (7). The results of this calculation are displayed on display means 8.

$$X = \left(j \cdot \frac{2\pi}{na} + \phi_1\right)\frac{L}{2\pi} \quad (7)$$

When value Δ is in the vicinity of 0 in formula (6), there is a possibility of the integral number being increased by +1. In such a case, the calculation may be done by assuming that j−1 is the real value when $\phi_1 < \pi$.

FIGS. 5 through 8 illustrate other types of sensor arrays 21, 22 and first and second grid patterns 11,12 on code plate 1.

Figure 5:
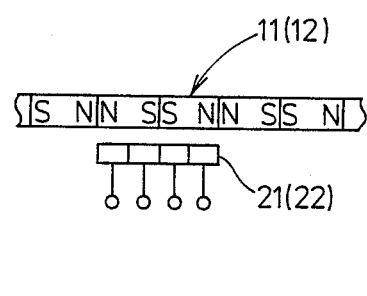
FIGS. 5 through 8 are diagrams depicting sensor arrays and different types of first and second grid patterns used in the code plate of the invention.

FIG. 5 shows an embodiment wherein magnetized portions N,S,S, N . . . are formed to represent items of information "1" and "0" in a grid pattern 11 (or 12). The sensor array 21 (or 22) may comprise Hall elements for detecting magnetic flux from the magnetized portions.

Figure 6:
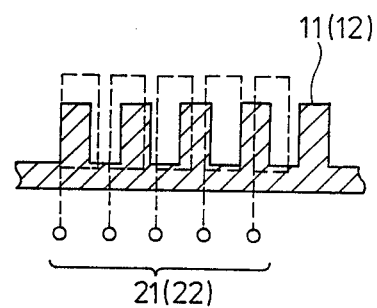

FIG. 6 shows another embodiment wherein items of information "1" and "0" are represented by a conductor pattern forming conductive and non-conductive portions on grid pattern 11 (or 12). A coil pattern is formed on sensor array 21 (or 22) so as to detect voltage signals caused by magnetic induction. The conductor pattern may also be made of a magnetic substance and the variations of inductance may be detected by a coil pattern array.

Figure 7:
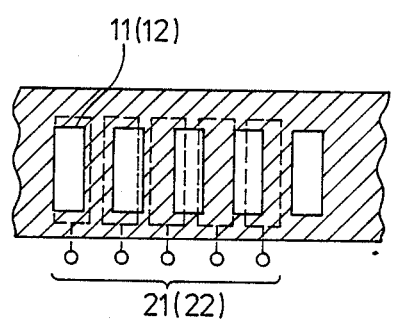

FIG. 7 shows a further embodiment wherein an electrically conductive flat plate forms slits therein as the grid pattern 11 (or 12). An electrode array facing the flat plate is used as sensor array 21 (or 22) and detects variations of capacitance at the electrode array. The information is stored as presence or absence of capacitance or as variations in capacitance.

Figure 8:
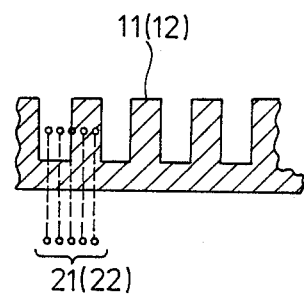

FIG. 8 shows another embodiment wherein grid pattern 11 (or 12) has electrically conductive electrode portions and non-conductive portions. A contact point array, for contacting the conductive electrode, is formed as sensor array 21 (or 22). The information is stored as presence of absence of electrical conductivity.

These embodiments have been described assuming that the first and second switch circuits 31,32 are scanned by reference signals having the same frequency. The first and second switch circuits 31 and 32, however, may be scanned by signals having different frequencies, sin $\omega a t$ and sin $\omega b t$. In such a case, formulas (1),(2) and (5) can instead be represented by below formulas (8),(9) and (10) respectively.

$$V_a = V_{a0} \sin\left(\omega a \cdot t + na\frac{2\pi X}{L}\right) \quad (8)$$

$$V_b = V_{b0} \sin\left(\omega b \cdot t + nb\frac{2\pi X}{L}\right) \quad (9)$$

$$\phi_a = |\omega a - \omega b|t + (na - nb)\frac{2\pi X}{L} \quad (10)$$

The above embodiments have been described with respect to arrangements providing linearly disposed grid patterns adapted to linear encoders. However, the invention may be equally applied to rotary type encoders wherein first and second grid patterns may be formed around the circumference of a code plate which forms a disk. The absolute angle is then measured.

In the above description, the relationship between lengths $P_3$ and $P_4$ (being the distance between which the sensors in the first and second sensor arrays 21,22 are disposed) and pitches $P_1$ and $P_2$ of the two sets of slits in which each item of information "1" and "0" is disposed, has not been specifically limited. The relationship between the pitches $P_1$ and $P_2$ of the two sets of slits can be of any value provided that pitch $P_1$ does not equal pitch $P_2$. Also, the relationship between length $P_3$ and $P_4$ of the sensor arrays 21,22 located behind the slits can be of any value provided that length $P_3$ does not equal length $P_4$. Although there are shown five photodiodes in each of sensor arrays 21,22, the invention is not limited to five. There should be at least three photodiodes within each length $P_3$ and $P_4$, but more can be used, as depicted in FIG. 1 to be five.

Figure 9:
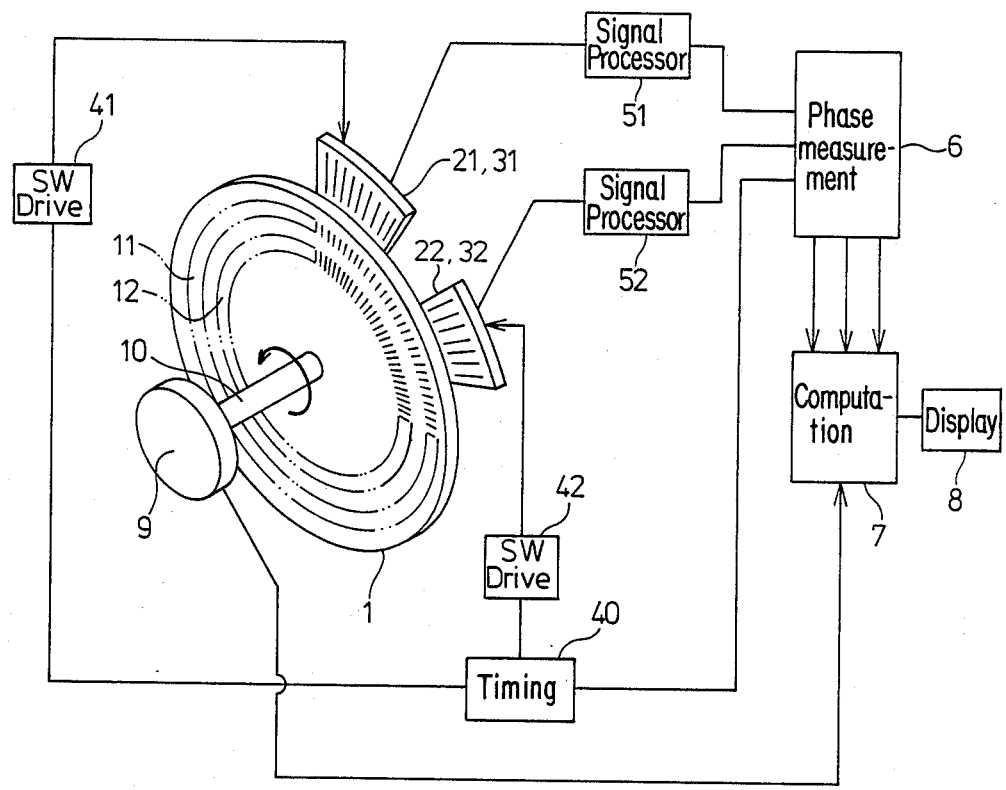
FIG. 9 is a perspective view depicting an illustrative application of the invention.

Turning now to FIG. 9, the value, indicating absolute position of a rotating shaft, is outputted as the number of rotations and the angle of rotation thereof. That is, code disk plate 1, on which are formed first and second grid patterns 11,12, each representing one full circuit around the circumference of the disk, is fixed to a rotating shaft 10, to which is also connected a revolution detector 9. Computation circuit 7 calculates the angle of rotation, representing the absolute position, by using signals related to phases $\phi_1$, $\phi_2$ and $\phi_a$ which are supplied from phase measurement circuit 6, and processes a signal supplied from revolution detector 9, so as to calculate the number of revolutions, finally obtaining a signal indicating the number of rotations and the absolute position of rotating shaft 10 by adding the resultant values of these calculations.

Since it suffices for revolution detector 9 to be capable of detecting only one revolution of rotating shaft 10, other known types of revolution counter, for example, an optical or magnetic type counter or a type of counter which uses magnetic bubble elements, are also applicable.

One example of dimensions and the characteristics of an encoder having the structure of FIG. 9 are as follows: Diameter of the code disk, $\phi51$; Diameter of the rotary disk 10, $\phi14$; Number of slits in the first grid pattern, 11 (number of slits over one round of the grid pattern); n=199. For the first and second sensory arrays 21, 31, 22 and 32, those having eight photodiodes arranged in one slit pitch of the code plate and further, those including as many parallelly connected photodiodes as corresponding to five slit pitches, are use for increasing the light receiving power and equalizing photosensitivity, thereby achieving the encoder accuracy (Accuracy 6.5 arc-sec) of 1/200,000.

Figure 10:
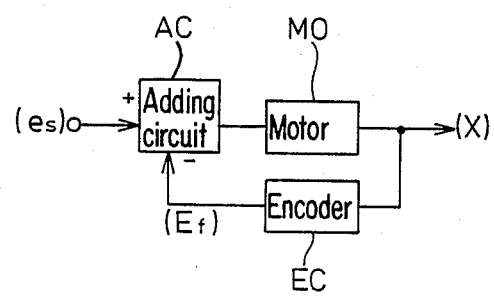
FIG. 10 is a block diagram depicting another illustrative application of the invention.

FIG. 10 depicts use of an encoder EC as a position signal feedback element. A servo apparatus capable of outputting the mechanical position with high accuracy and resolution is thereby realized. In this arrangement, a position setting signal $e_S$ is fed to an adding circuit AC as one input signal, and the output signal from adding circuit AC is fed to a motor MO and the motor outputs the mechanical position. The motor MO may be a linear motor, a stepper motor or a direct current servo motor. The encoder EC, according to the invention, is adapted for detecting the mechanical position and comprises a code plate and sensor array for detecting the grid pattern on the code plate. The output signal $E_f$ of this encoder is fed back to the adding circuit AC as another input signal thereof. A circuit loop comprising adding circuit AC, motor MO and encoder EC functions to make position setting signal $e_S$ equal to output signal $E_f$ of encoder EC, thus obtaining the mechanical position output X of motor MO relative to position setting signal $e_S$. According to this application, it is assumed that the encoder EC performs through its computation circuit, calculations based on the absolute position method represented by formula (7). Computation circuit 7, however, may generally calculate either the phase angle $\phi_1$ or $\phi_2$ in accordance with the incremental method and feed back the results of the calculation so that calculation based on the absolute position method is carried out as desired in accordance with a mode changing signal during, for example, a checking process only.

Figure 11:
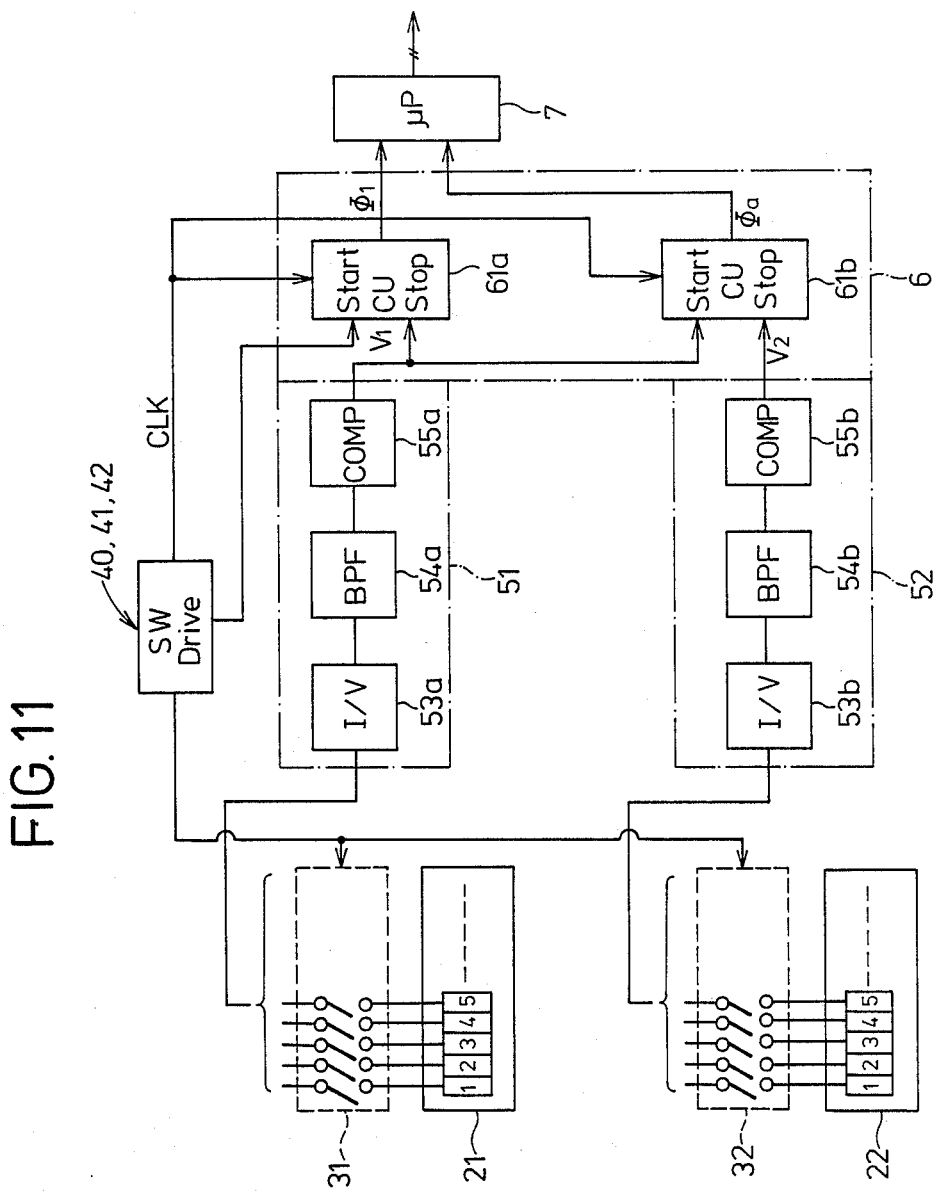
FIG. 11 is a block diagram depicting a signal processing circuit and a phase measurement circuit used in the embodiment of FIG. 2.

FIG. 11 depicts a group of signal processing circuits 51,52, and phase measurement circuit 6. In this arrangement, signal processing circuits 51,52, each comprises an I/V converting circuit 53a,53b for converting the output current signals of switch circuits 31 and 32 into voltage signals, a comparator 55a,55b, for changing sine wave signals $V_a$ and $V_b$ from band pass filters 54a, 54b into rectangular waves $V_1$ and $V_2$.

Phase measurement circuit 6 comprises interval counters 61a, 61b. One interval counter 61a starts counting clock pulses CLK when supplied with a starting pulse from timing circuit 40, and stops counting the clock pulses CLK when supplied with the output signal from comparator 55a. Digital signals relative to the phase angle $\phi_1$ of alternating signal $V_1$, supplied from sensor array 21, through switch circuit 31, are thereby obtained from interval counter 61a. The other interval counter 61b starts counting clock pulses CLK when supplied with the output signal from comparator 55a and stops counting the clock pulses when supplied with the output signal from comparator 55b. Digital signals relative to the difference $\phi_a$ between the alternating signal $V_1$ and the alternating signal $V_2$ fed from the sensor array 22 through the switch circuit 32 are thereby obtained from interval counter 61b.

Figure 12:
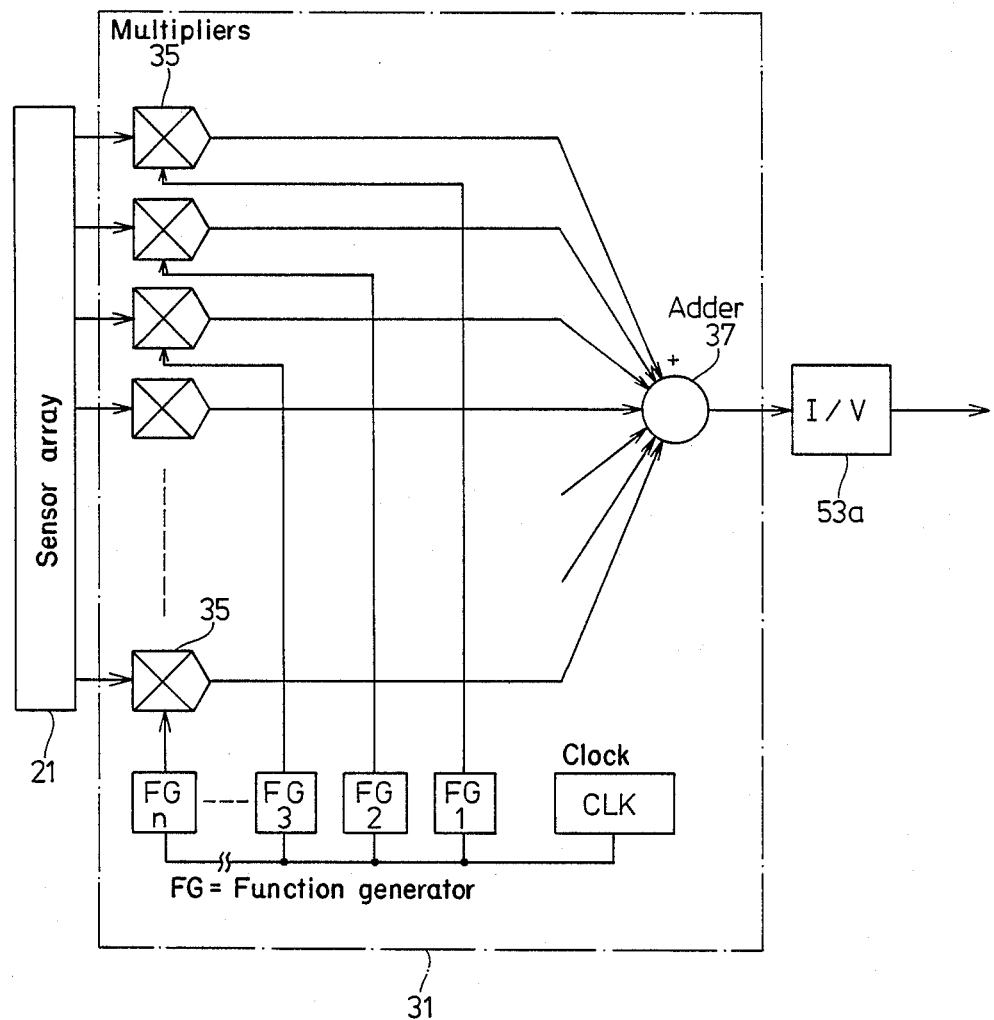
FIG. 12 is a block diagram depicting another illustrative switch circuit used in the embodiment of FIG. 11.

FIG. 12 depicts details of the group of switch circuits 31,32 shown in FIG. 11. These circuits are described with respect to signal lines connected to sensor array 21.

Each signal fed from photodiodes in the sensor array 21 is fed to an adder 37 through each of multipliers 35 for weighting the signals. The multiplier 35 is supplied with a given function signal from each of function generators $FG_1 \ldots FG_n$ (n corresponds to the number of photodiodes in the sensor array 21).

The simplest form of the multiplier 35 is a switch element, which can pick up a signal from the sensor array 21 by scanning the sensor array in accordance with signals "1" and "0" supplied from the function dgenerator FG.

Figure 13:
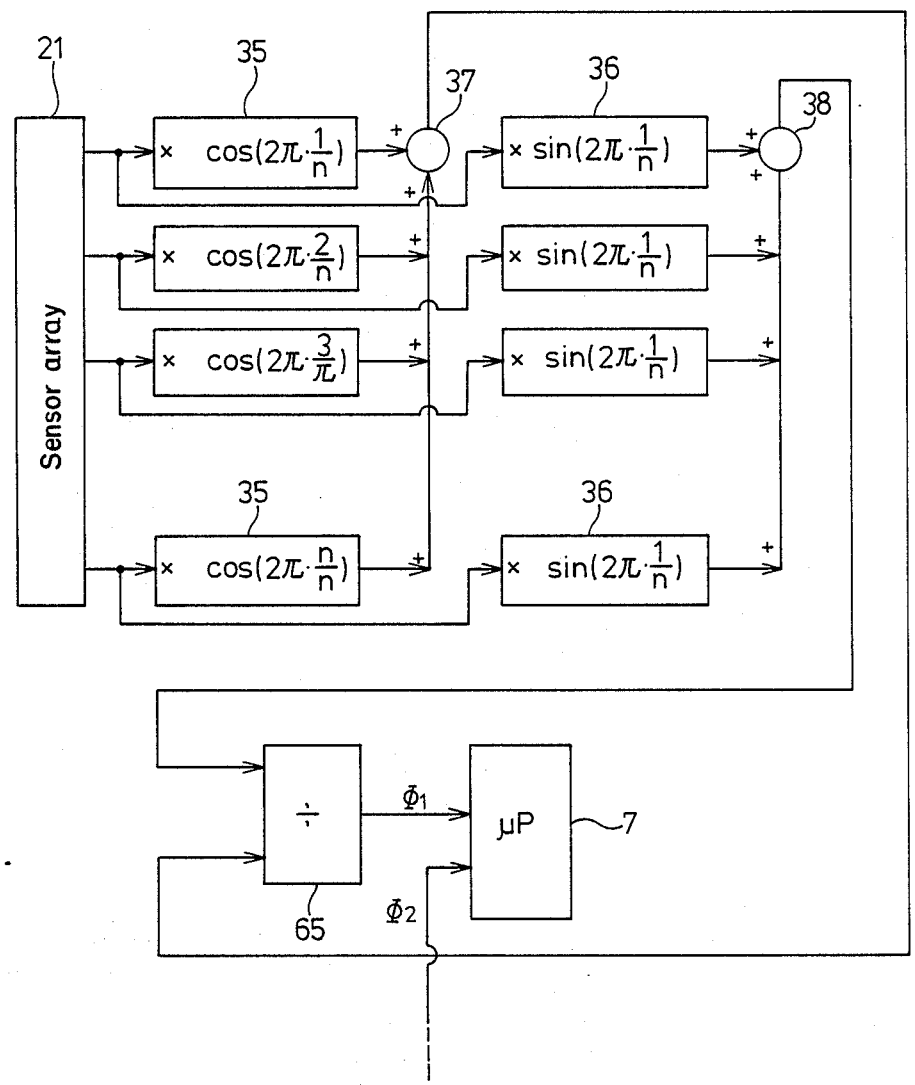
FIG. 13 is a block diagram depicting further illustrative switch circuit, signal processing circuit and phase measurement circuit which are used in the embodiment of FIG. 2.

FIG. 13 depicts the group of switch circuits, signal processig circuit and phase measurement circuit of FIG. 2. To simplify description, these circuits are described with respect to only signal lines connected to the sensor array 21. Each of the signals supplied from the photodiodes in sensor array 21 is multiplied by cos $(2\pi i/n)$ (wherein i is an integral number 1,2, ... n, and n corresponds to the number of photodiodes in sensor array 21) through action of multiplier 35 which also acts as a switch, and is added to to each other by adder 37 and then multiplied by sin $(2\pi i/n)$ through action of multiplier 36 which also acts as a switch, finally being added to each other by adder 38.

Assuming that the output signal of sensor array (e.g. 21) is $P(\theta)$, then a signal Va output from adder 37 and a signal Vb output from adder 38 are respectively represented by the following formula $$Va = \frac{1}{\pi} \int_0^{2\pi} P(\theta)\cos\theta d\theta \quad (11)$$

$$Vb = \frac{1}{\pi} \int_0^{2\pi} P(\theta)\cos\theta d\theta \quad (12)$$

Then, the output signal $P(\theta)$ from sensor array 21 may be assumed to be a Fourier series, such as represented by the following formula.

$$P(\theta) = \frac{1}{2} a_0 + \sum_{n=1}^{\infty} (a_n\cos n\theta + b_n\sin n\theta) \quad (13)$$

wherein $$a_n = \frac{1}{n} \int_0^{2\pi} P(\theta)\cos n\theta d\theta$$

$$bn = \frac{1}{n} \int_0^{2\pi} P(\theta)\sin n\theta d\theta$$

In formula (13), weight of the cosine corresponds to $a_1$ and weight of sine corresponds to $b_1$ with $a_1$ and $b_1$ being respectively weighted by adder 35 and multiplier 36.

A dividing circuit 65 is supplied with output signals Va and Vb, fed from the adders 37,38, respectively, and carries out calculation Vb/Va, thus, obtaining a phase output $\phi_1$ (which is equal to arc tan $(b_1/a_1)$).

The above described signal processing circuit and phase measurement circuit are illustrative, and other circuit arrangements may be used instead. The calculated signal obtained by the computation circuit may be transmitted in the form of digital signals or may be remotely transmitted after conversion into pulse width signals.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A encoder of the absolute position type, comprising
   a code plate having a first grid pattern wherein items of information, represented by 1 and 0, are disposed periodically, and a second grid pattern wherein items of information, represented by 1 and 0, are disposed periodically at a pitch slightly different from that of the disposition of said first grid pattern;
   a first and a second sensor array, each comprising a plurality of detecting elements, for respectively detecting said first and second grid patterns and moved in relation to said code plate;
   driving means for driving said first and second sensory arrays, said driving means comprising
      first and second switching circuits, each comprising a plurality of switches connected to said plurality of detecting elements of said first and second sensory arrays,
      a timing circuit for generating clock pulses and an alternating reference signal, and
      drive circuit means responsive to said clock pulses for turning ON and OFF said plurality of switches of said first and second switching circuits in a sequence according to a predetermined cycle thereby to transmit signals from said detecting elements;
   signal processing means for obtaining alternating output signals from said first and second sensory arrays as switched by said first and second switching circuits in response to operation of said driving means;
   phase measuring means responsive to said alternating output signals and said alternating reference signal for measuring difference between phase angles of said alternating output signals and difference between phase angles of said alternating output signals and said reference alternating signal, said phase measuring means comprising a first interval counter for counting said clock pulses in response to a signal from said second switch circuit and for stopping the counting in response to a signal from said first switch circuit, and a second interval counter for counting said clock pulses in response to a signal from said first switch circuit and for stopping the counting in response to a signal from said second switching circuit thereby to enable measurement of the differences of phase angles; and
   computation means responsive to said difference of phase angles between said alternating output signals and said difference of phase angles between said alternating output signals and said reference signal for calculating the position using said differences of phase angles.

2. The encoder of claim 1, wherein said first and second grid patterns comprise optical patterns forming repeated areas of transparent and non-transparent portions to represent said information; and wherein said first and second sensor arrays comprise photodiodes to detect light through said transparent portions.

3. The encoder of claim 1, wherein said first and second grid patterns comprise a plurality of magnetic portions having the polarities arranged N,S,S,N . . . , to represent said information; and wherein said first and second sensor arrays comprise magnetic flux detecting elements for detecting magnetic fluxes from said magnetic portions.

4. The encoder of claim 1, wherein said first and second grid patterns comprise a plurality of conductive and non-conductive portions to represent said information; and wherein said first and second sensor arrays comprise coil patterns.

5. The encoder of claim 1, wherein said first and second grid patterns comprise a plurality of slits formed in an electrically conductive flat plate to represent said information; and wherein said first and second sensory arrays comprise electrode arrays facing said flat plate so as to detect capacitances between said flat plate and said first and second sensor arrays.

6. The encoder of claim 1, wherein said first and second grid patterns comprise a plurality of electrically conductive electrodes and non-conductive portions to represent said information; and wherein said first and second sensor arrays comprise contact point arrays for contacting said electrodes.

7. The encoder of claim 1, where further comprising an adding circuit supplied with a position setting signal as one input signal, and a motor means for outputting a mechanical position in relation to the output signal of said adding circuit, said code plate and said first and second sensor arrays being movable in accordance with said mechanical output of said motor means, and wherein a position signal output from said computation means is fed back to said adding circuit as another input signal thereof.

8. The encoder of claim 1, wherein said computation means calculates the phase angle of said alternating signals on the basis of an incremental method and calculates the position based on an absolute position method in accordance with a mode changing signal.

9. The encoder of claim 1, comprising means for weighting in a given manner signals outputted from sensor elements in said first and second sensor arrays and for adding to each other said signals, thereby obtaining an alternating signal.

10. The encoder of claim 1, wherein further comprising means for weighting by sine and cosine signals signal outputted from said sensor arrays and for dividing a signal to which said cosine signal is added and a signal to which said sine signal is added, thereby to obtain a signal relative to the phase angles of said signals outputted from said sensory arrays.

* * * * *